United States Patent
Nagata

[19]

[11] Patent Number: 5,848,006
[45] Date of Patent: Dec. 8, 1998

[54] REDUNDANT SEMICONDUCTOR MEMORY DEVICE USING A SINGLE NOW ADDRESS DECODER FOR DRIVING BOTH SUB-WORDLINES AND REDUNDANT SUB-WORDLINES

[75] Inventor: Kyoichi Nagata, Tokyo, Japan

[73] Assignee: NEC Corporation, Tokyo, Japan

[21] Appl. No.: 753,945

[22] Filed: Dec. 3, 1996

[30] Foreign Application Priority Data

Dec. 6, 1995 [JP] Japan .................................. 7-317814

[51] Int. Cl.$^6$ ...................................................... G11C 8/00
[52] U.S. Cl. .............. 365/230.06; 365/200; 365/189.08; 365/230.08; 365/230.03; 365/225.7
[58] Field of Search .............................. 365/230.06, 200, 365/189.08, 230.08, 230.03, 225.7

[56] References Cited

U.S. PATENT DOCUMENTS 5,581,508 12/1996 Sasaki et al. ............................. 365/200
5,596,542 1/1997 Sugibayashi et al. ............. 365/230.06

*Primary Examiner*—David C. Nelms
*Assistant Examiner*—Andrew Q. Tran
*Attorney, Agent, or Firm*—McGinn & Gibb, P.C.

[57] ABSTRACT

A drive circuit for a semiconductor memory device in which a plurality of memory cell arrays are driven by a divisional decode system, includes a single, row address decoder including a plurality of address latch circuits for holding an address signal for normal operation via a first logic gate unit, and a plurality of normal/redundancy switching circuits for inputting therein held data, and an address signal for redundancy purposes, and for switching the input signal in response to a judging signal for redundancy purposes. The outputs of the switching circuits are activated through a second logic gate unit into which a row address enable signal is inputted. Thus, a driver selection signal during normal operation and a driver selection signal during a redundancy operation are commonly used. As a result, a total number of wiring lines and the number of driver circuits, as well as the chip area, are reduced.

30 Claims, 7 Drawing Sheets

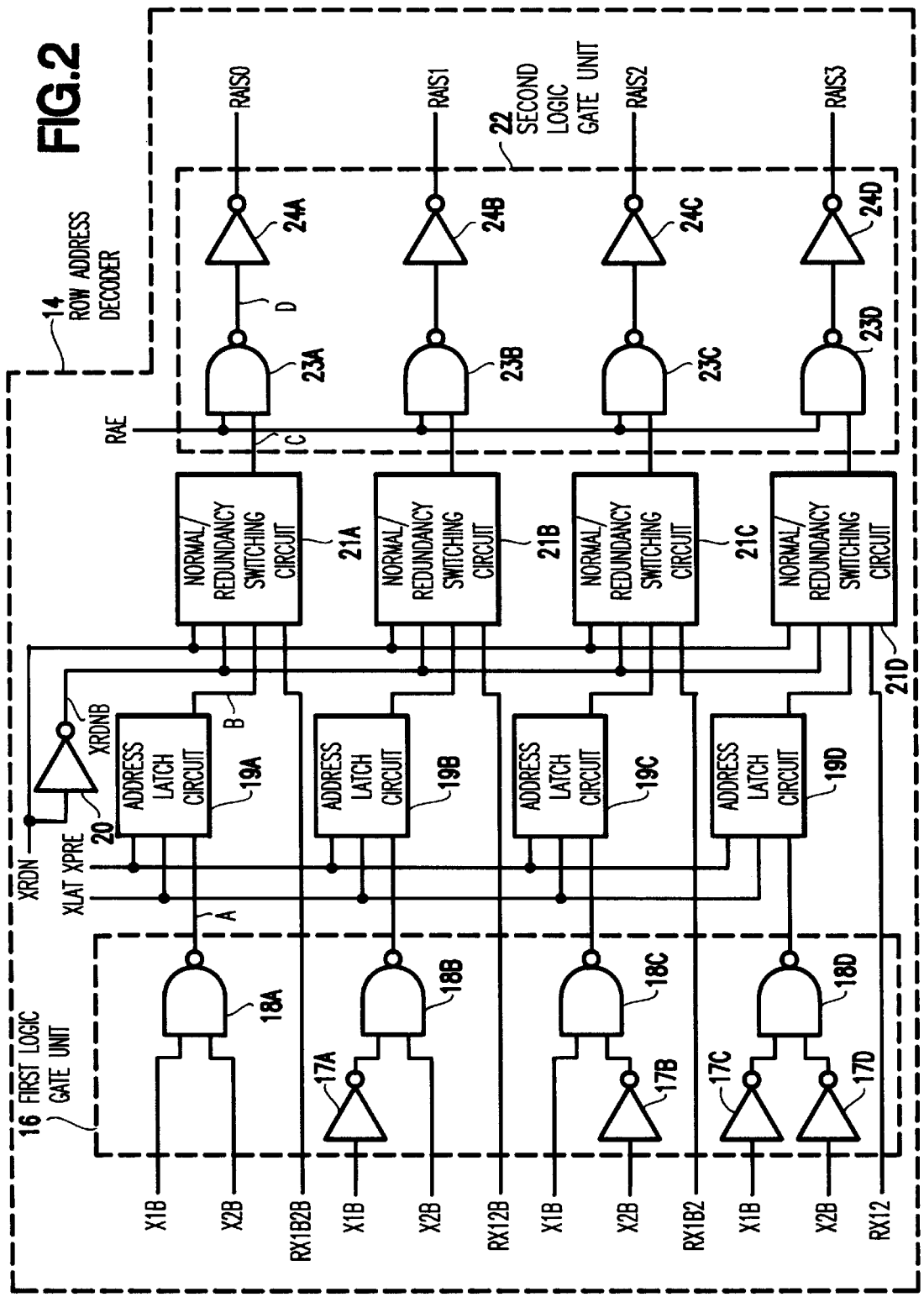

REDUNDANT SEMICONDUCTOR MEMORY DEVICE USING A SINGLE NOW ADDRESS DECODER FOR DRIVING BOTH SUB-WORDLINES AND REDUNDANT SUB-WORDLINES

BACKGROUND OF THE INVENTION

The present invention generally relates to a method and circuit for driving a semiconductor memory device, and more specifically to a method and circuit for driving a semiconductor memory device equipped with a redundancy circuit.

Description of the Related Art

Conventionally, in semiconductor memory devices such as dynamic random access memories (DRAMs), the higher the integration of the semiconductor memory devices becomes, the higher the defect occurrence rates become.

More specifically, many defects occur in memory element regions (e.g., memory cell arrays) as the integration (e.g., density) increases. To eliminate such defects in the memory cells, redundancy circuits are provided typically.

FIG. 6 shows a drive circuit diagram of an exemplary "related art" memory cell array and row address decoder, and which for brevity and clarity does not illustrate any peripherals. More specifically, FIG. 6 illustrates one "related art" semiconductor memory device (DRAM) 10a, which includes a plurality of subdivided memory cell arrays 11, a plurality of subword drivers (SWD) 12a for driving each of the subdivided memory cell arrays 11, a plurality of sense amplifiers (SA) 13which are driven during read operations, and a plurality of subword drivers (RSWD) 12b for redundancy purposes, which correspond to a plurality of subword drivers (SWD) 12a. The plurality of subdivided memory cell arrays 11 are subdivided into the row direction by the SWD 12a and also into the column direction by the SA 13.

Such a drive circuit for selecting the memory cell array 11 of the DRAM 10a includes an X decoder and a Y decoder (not illustrated in FIG. 6). The X decoder includes a row address decoder 14a, a row address decoder 14b for redundancy purposes, a plurality of row address (R) drivers 15a driven by the row address decoder 14a, and a plurality of row address (RR) drivers 15b for redundancy purposes driven by the row address decoder 14b.

In this subdivided decode-type word driver, one of the plurality of SWDs 12a is selected by the X decoder. The row address (RAI) signal corresponding to the output signal of the R driver 15a is inputted to the selected SWD 12a, so that one of these selected subword lines (SWL) is selected.

However, if a defective address in the memory cell array 11 is selected, then the RSWD 12b for redundancy is selected via the RR driver 15b by the row address decoder 14b. The defective address is known in advance (earlier detected) by the program and testing, and the defective address is supplied by the redundancy decoder. To this selected RSWD 12b, the redundancy row address (RRAI) signal is inputted which is the output signal from the redundancy RR driver 15b, so that one of the selected redundancy subword lines (RSWLs) is selected.

On the other hand, for example, a 4-bit RAI signal and a 4-bit RRAI signal, which are used to drive the R driver 15a and the RR driver 15b, are activated by the row address decoder 14a and the row address decoder 14b for redundancy. The row address decoder 14a decodes the X address signals X1B and X2B, thereby to produce four signals X1B2B, X12B, X1B2 and X12, and outputs a 4-bit row address driver activated signal (RAIS) signal in response to an input timing of a row address enable (RAE) signal.

Additionally, since the redundancy address signals RX1B2B, RX12B, RX1B2, and RX12 which have already been decoded are inputted into the row address decoder 14b for redundancy proposes, the redundancy address decoder 14b outputs a 4-bit redundancy row address driver activated (RRAIS) signal by inputting the row address enable (RAE) signal.

However, the "related art " DRAM drive circuit has a problem in that both the subword driver (SWD) and the redundancy subword driver (RSWD) during normal operation, which are connected to the peripheral portion of the memory cell, are separately required.

Consequently, the R driver, the RR driver, or the X decoder, which drive these drivers (SWD, RSWD), must be provided in the circuit, thereby making the circuit larger and more complex than required by the circuit. Additionally, the row address decoder and the redundancy row address decoder must be provided separately, to drive the R driver and the RR driver.

In the above "related art" drive circuit of the semiconductor memory device, since the row address decoder 14a used during normal operation of the memory cell and the redundancy row address decoder 14b used during abnormal operation (e.g., when defects occur) of the memory cell are separated from each other, the row address driver 15a and the redundancy row address driver 15b also should be separated from each other accordingly. The row address driver 15a and redundancy row address driver 15b are the output destination by the row address decoder 14a and the redundancy row address decoder 14b, respectively, and drive the subword driver 12a and the redundancy subword driver 12b. Consequently, the row address driver 15a, the redundancy row address driver 15b, the subword driver 12a, and the redundancy subword driver 12b are connected together by respective wiring lines.

Moreover, both decoders 14a, 14b, are separately connected to the row address driver 15a and the redundancy row address driver 15b. Accordingly, a total number of wiring lines is increased, and the required chip area is increased. Thus, valuable chip "real estate" is consumed unnecessarily.

Additionally, in the "related art" drive circuit of the semiconductor memory device, the number of wiring lines which pass over the subword driver 12a and the redundancy subword driver 12b is similarly increased. Thus, the chip area is further increased.

SUMMARY OF THE INVENTION

In view of the foregoing problems of the "related art" circuits, it is an object of the present invention to provide a method and circuit for driving a semiconductor memory device, which reduces a total number of wiring lines for the device, and which further reduces a chip area.

In a first aspect of the present invention, a drive circuit of a semiconductor memory device for driving a plurality of memory cell arrays by a "divisional decoding system", includes one row address decoder.

The one row address decoder includes a first logic gate unit for decoding a row address signal; an address latch circuit for separating and holding an output of the first logic gate unit in response to an address latch signal and a precharge signal; a normal/redundancy switching circuit for switching an output of the address latch circuit during a first (e.g., normal) operation and a row address signal during a second operation (e.g., redundancy) in response to a normal/redundancy judging signal; and a second logic gate unit for producing row address decode signals used for the plurality of memory cell arrays by activating the output of the normal/redundancy switching circuit in response to a row address enable signal.

Further, the decode signal during the first (e.g., normal) operation is separated and held, whereas the decode signal during the normal operation and the decode signal during the second (e.g., redundancy) operation are provided as the same output.

Preferably, the address latch circuit in the drive circuit of the semiconductor memory device, according to the present invention, includes a first switching transistor for inputting therein the output of the first logic gate unit, and whose gate is controlled by the address latch signal; a second switching transistor connected between the first switching transistor and a power source, and whose gate is controlled by the precharge signal; and a data holding circuit connected between the first switching transistor and an output, and which comprises a complementary-metal-oxide semiconductor (CMOS) inverter.

Furthermore, the normal/redundancy switching circuit in the drive circuit of the semiconductor memory device, according to the present invention, preferably includes first and second transfer gates, each of the first and second transfer gates preferably being fabricated by a CMOS transistor.

Further, each of the first and second transfer gates preferably inputs therein a decode signal of a normal address and a decode signal of a redundancy address, and outputs of the transfer gates are preferably controlled based upon the normal/redundancy judging signal.

In a second aspect of the present invention, a method for driving a plurality of memory cell arrays of a semiconductor memory device, includes steps of providing a single, row address decoder; decoding, by a first logic gate unit of the row address decoder, a row address signal; holding, by an address latch circuit of the row address decoder, the output of the first logic gate unit in response to an address latch signal and a precharge signal; switching, by a normal/redundancy switching circuit of the row address decoder, the output of the address latch circuit during a first operation and a row address signal during a second operation in response to a first/second judging signal; and producing, by a second logic gate unit of the row address decoder, row address decode signals used for the plurality of memory cell arrays by activating an output of said first/second switching circuit in response to a row address enable signal.

Preferably, the decode signal during the first operation is separated and held, and wherein the decode signal during the first operation and the decode signal during the second operation are made as the same output.

In a third aspect of the invention, a memory, includes a plurality of memory cells blocks, a plurality of subword drivers, corresponding to the plurality of memory cell blocks, for selecting respective subword lines, and a plurality of row drivers for providing information to the subword lines. The drivers receive first and second types of information depending on a normal mode and a redundancy mode.

In a fourth aspect of the present invention, a memory includes at least one main word line, at least one redundant main word line, a first driver for driving the main word line, a second driver for driving the redundant word line, a device for issuing first and second signals, and a row driver common to both first and second drivers for outputting a same output to each of the first and second drivers, depending upon receipt of one of the first and second signals.

In yet another aspect of the present invention, a semiconductor device includes a subword driver receiving a row address signal and an address signal outputted from a decoder and selecting one of a plurality of subword lines, a row driver for receiving a row-address-activate-signal and for driving a row address by the row-address-activate-signal, a row address decoder for receiving address signals, redundancy address signals and a judging signal, and for outputting a row-address-activate-signal corresponding to the address signals by the judging signal having a first level in a normal mode, and for outputting a row-address-activate-signal, corresponding to the redundancy address signal, by the judging signal having a second level in a redundancy mode.

With the unique and unobvious structure and method of the present invention, since a plurality of decoders are not provided separately connected to the row address driver and the redundancy row address driver, the total number of wiring lines is decreased, and the chip area is decreased, as compared to the "related art" circuits.

Further, the number of wiring lines which cross over the subword driver and the redundancy subword driver are decreased, as compared to the "related art" circuits described above.

More specifically, the row address driver selection signal during the normal operation is made identical to the row address driver selection signal during redundancy, so that the row address driver is commonly utilized, and the number of row address wiring lines which cross over the subword drivers can be reduced by one-half (½). Therefore, the chip size can be greatly reduced.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a circuit diagram of a row address decoder in the drive circuit shown in FIGS. 1A–1C;

DETAILED DESCRIPTION OF A PREFERRED EMBODIMENT OF THE INVENTION

Figure 1A:
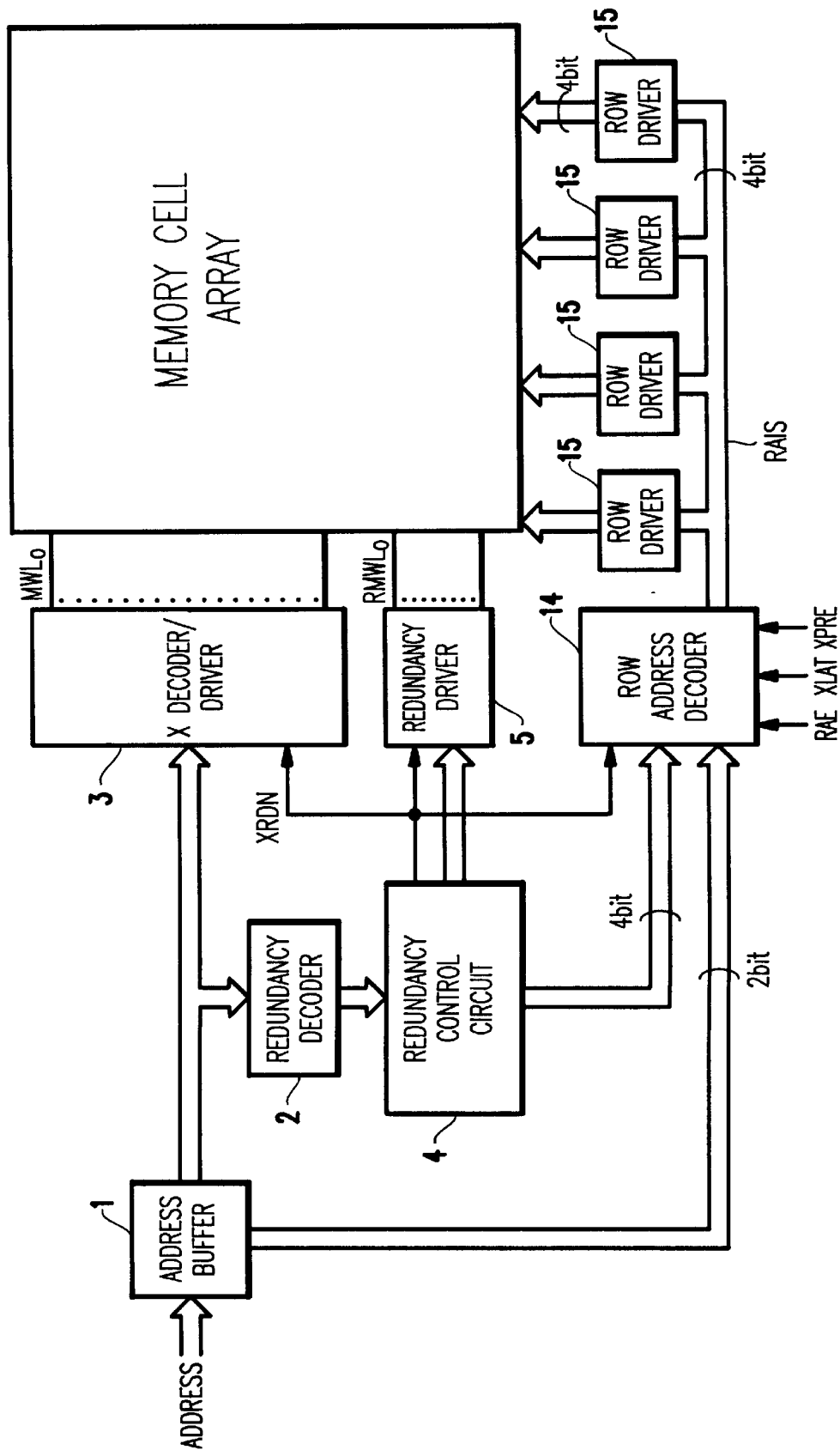
FIG. 1A is a schematic of a drive circuit of a semiconductor memory device according to a first preferred embodiment of the present invention.

Referring now to the drawings, and more particularly to FIGS. 1A–1E, there is shown a first preferred embodiment of a first drive circuit of a semiconductor memory device according to the present invention utilizing a "divisional decoding system". For purposes of this application, the term "divisional decoding system" used throughout the application, means the X decoder selecting a main word line (MWL) and the subword line driver being detected by another driver.

FIG. 1A illustrates an overall configuration of the circuit and shows an address buffer 1, which receives an address including bits X1–X12, at its input terminal. Address buffer 1 provides a first address input to a redundancy decoder 2 and to an X decoder/driver 3. The X decoder/driver 3 is selected by bits X3–X12 and is coupled to provide inputs to a memory cell array 11 which includes a plurality of memory block cells (illustrated in FIG. 1B as discussed below). The X decoder/driver 3 selects a main word line MWL of the memory cell array 11, based on the address input from the address buffer 1.

Redundancy decoder 2 provides an input to a redundancy control circuit 4 based on the address input from the address buffer 2. Redundancy control circuit 4 provides a 4-bit output to a redundancy driver 5, which is selected by bits X1 to X12. Redundancy control circuit 4 also issues a judging signal (e.g., an XRDN signal discussed in further detail below) to the X decoder/driver 3 and to the redundancy driver 5.

Address buffer 1 also provides a 2-bit input to row address decoder 14. Specifically, row address decoder 14 is selected by bits X12 to X2. Row address decoder 14 also receives an output from redundancy control circuit 4 as well as the XRDN issued by the redundancy control circuit 4 and discussed in further detail below.

Row address decoder 14 also receives RAE, XLAT, and XPRE (discussed in further detail below) from a row address strobe (RAS) generator 7 (also discussed below with regard to FIG. 1E), and issues an RAIS signal to a selected one of a plurality of row drivers 15. Row drivers 15 issue 4-bit signals to selected memory cells of the memory cell array 11.

Figure 1B:
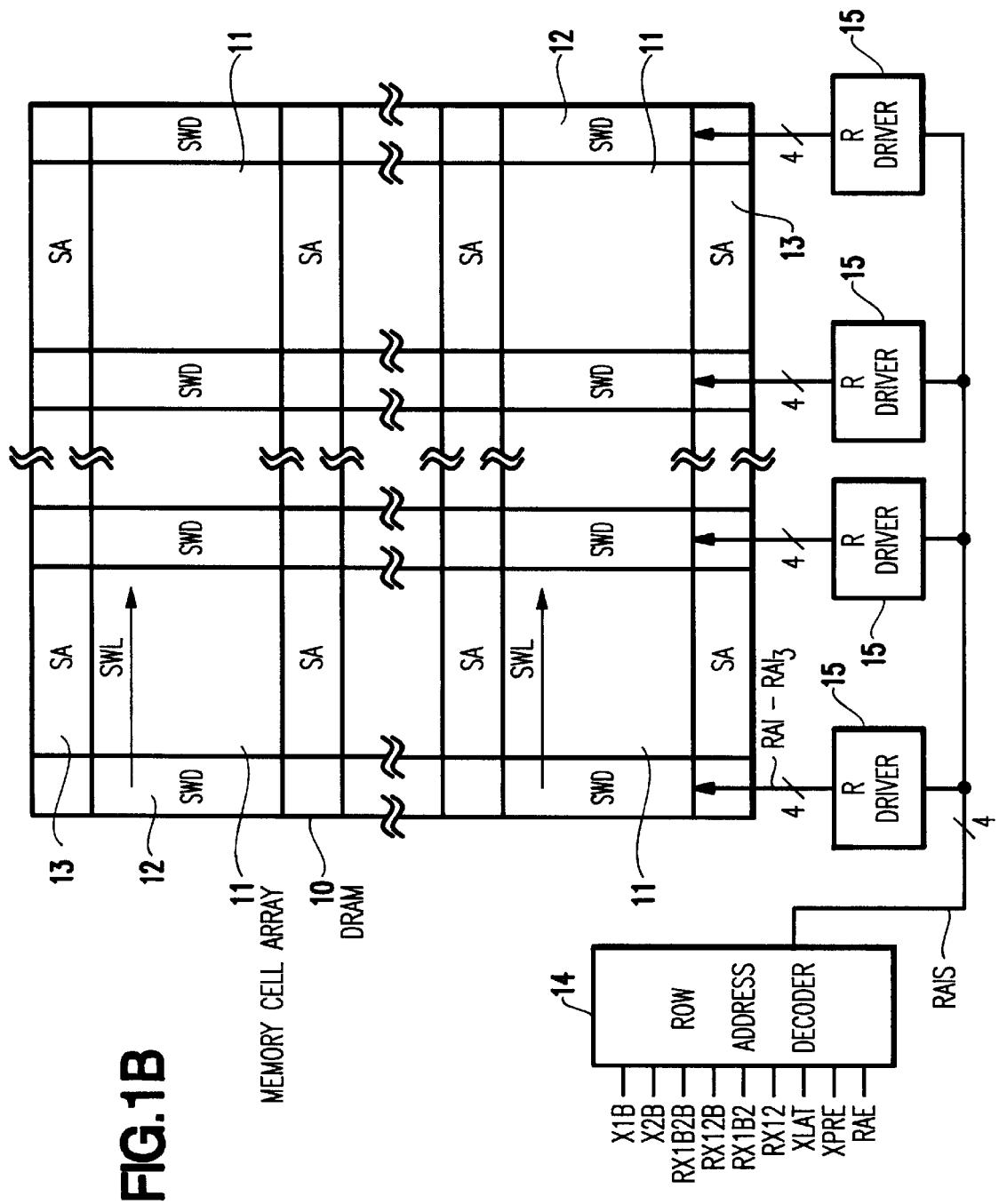
FIG. 1B illustrates in greater detail the drive circuit of the semiconductor memory device according to the first preferred embodiment of the present invention, including an row address decoder, row driver and memory array.

Referring now to FIG. 1B, the drive circuit of the semiconductor memory device shown in FIG. 1A is shown in greater detail and is for driving a plurality of memory cell arrays 11 in a divisional decoding system, which form a semiconductor memory device (Dynamic random access memory (DRAM)) 10.

DRAM 10 includes a plurality of subdivided memory cell arrays 11, a plurality of subword drivers (SWD) 12 for driving each of these subdivided memory arrays 11, and a plurality of sense amplifiers (SA) 13 driven during read operations. The plurality of subdivided memory cell arrays 11 are subdivided by the SWDs 12 along the row direction (e.g., for convention, along the X direction), and by the SAs 13 along the column direction (e.g., the Y direction).

Similarly to the "related art" circuit described above, the drive circuit for selecting the memory cell arrays 11 of the DRAM 10 employs the X decoder/driver 3 and a Y decoder (not shown).

The inventive drive circuit utilizes the row address decoder 14 functioning as a portion of the X decoder, and the plurality of row address (R) drivers 15 driven by the row address decoder 14.

First, the divisional decoder-type word driver selects one of the plurality of SWDs 12 by the X decoder, in a manner similar to the "related art" circuit discussed above. A row address selection signal (RAI) corresponding to an output signal of the R driver 15 is inputted into the selected SWD 12. Consequently, one subword line (SWL) is selected among the plurality (e.g., four subword lines shown in FIG. 1C) of subword lines of the memory cell 11.

Figure 1D:
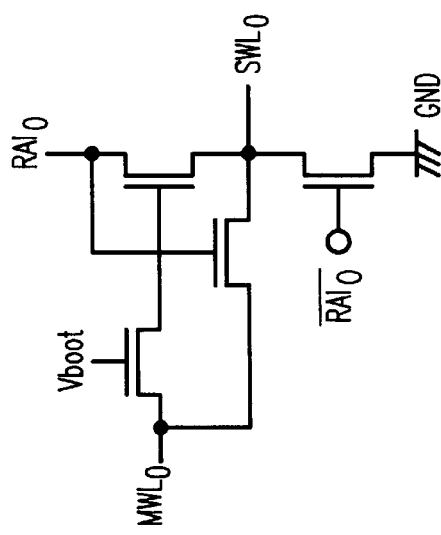
FIG. 1D illustrates a portion of a subword driver circuit.
Figure 1E:
FIG. 1E illustrates a row address strobe (RAS) timing generator.
Figure 1C:
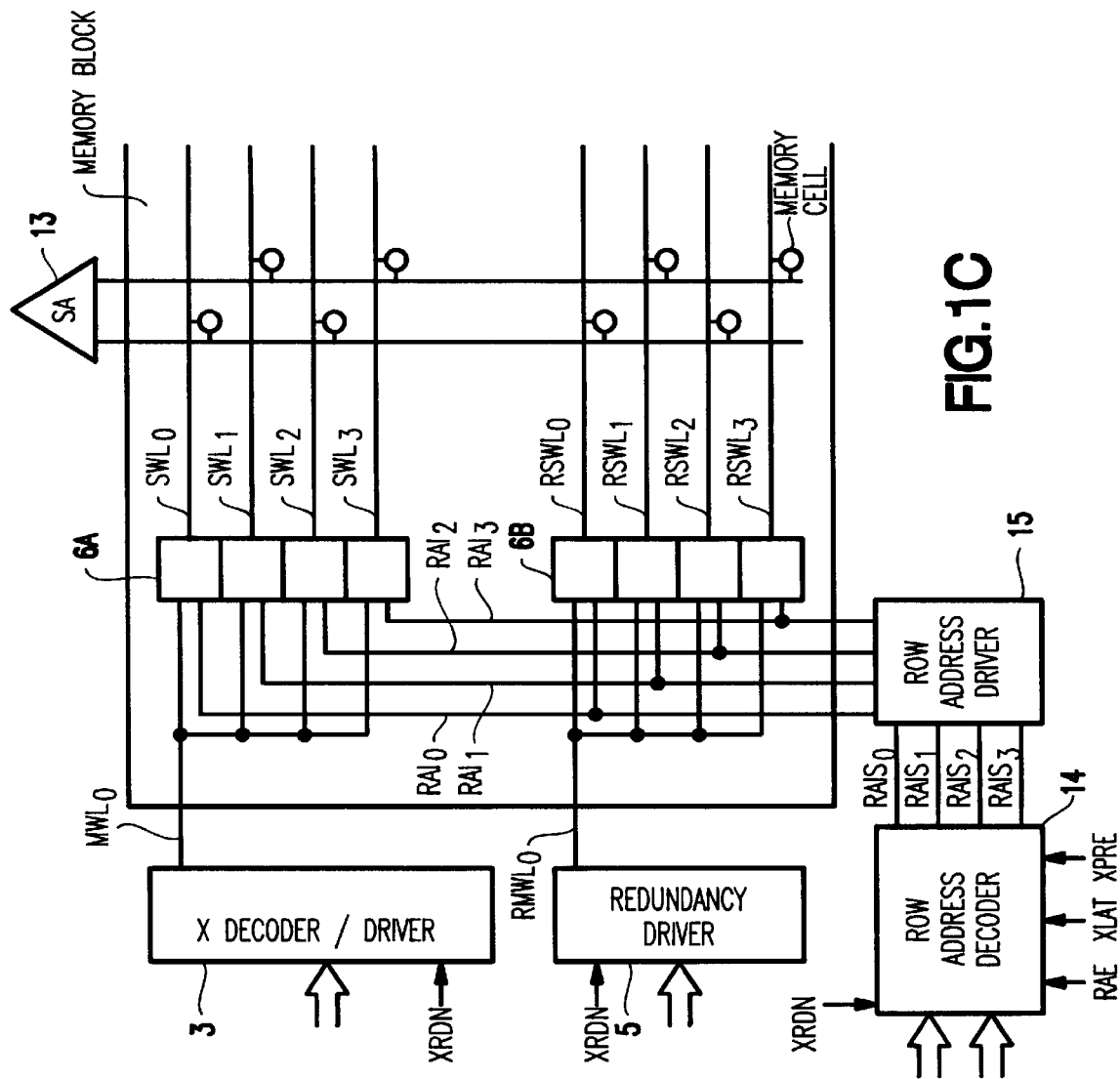
FIG. 1C illustrates a detailed circuit configuration of the memory array and the drive circuit coupled thereto according to the first preferred embodiment.

FIG. 1C illustrates a portion of a memory block of the memory cell array along with the driving circuitry. Specifically, the X decoder/driver 3, redundancy driver 15, row address decoder 14, row address driver 15, as well as the portion of an exemplary memory block are shown. The decoder/driver 3 is coupled to subword lines SWL0–SWL3, of the memory block via a main word line MWL0 and respective drivers 6 corresponding to respective ones of the subword lines SWL0 SWL3. The subword lines in turn are associated with (intersect) bit lines (unreferenced), thereby forming memory cells for being driven (e.g., and read-out by the sense amplifier SA 13 and associated circuitry).

The redundancy driver 5 is coupled to the redundant subword lines RSWL0–RSWL3 of the memory block via a redundant main word line RMWL0 and respective drivers 6B corresponding to respective ones of the redundant subword lines RSWL0–RSWL3. The redundant subword lines in turn are associated with (e.g., intersect) the bit lines (unreferenced), thereby forming memory cells for being driven (and read-out by the sense amplifier).

An exemplary row address driver 15 (e.g., formed by a plurality of buffers or the like corresponding in number to the number of subword line drivers) is shown in FIG. 1C for providing RAI0–RAI3 inputs commonly to respective ones of the subword drivers 6A and the redundant subword drivers 6B depending upon an input from the row address decoder 14. The MWL0 and the RAI signals activate a respective subword line of the four exemplary subword lines. The redundant subword lines are activated similarly dependent on RMWL0 and RAI signals.

For example, the row address driver 15 activates the respective lines with the respective RAI0–RAI3 having a predetermined voltage within a predetermined range (e.g., 2.4 V to 3.7 V). Thus, for example, the row address driver 15 outputs RAI0 with a voltage of 2.4 V, whereas the RAI3 signal is output with a voltage of 3.7 V.

As explained above (and in greater detail below with regard to FIGS. 2 and 3), the redundancy driver 5 is not activated during a normal operation. However, when a redundancy cell is selected, the X decoder 3 for the main word line (MWL) is not activated, but instead a designated redundant subword line driver 6B and redundant subword line RSWL is selected.

FIG. 1D illustrates an exemplary configuration of the subword driver circuits 6A. As shown, the main word line MWL signal and one of the respective RAI signals (e.g., RAI0–RAI3) activate a respective one of the subword line (SWL) of the four exemplary SWLS. Redundant subword driver circuits 6B have a similar configuration as that of the subword driver circuits 6A, and are similarly activated by the redundant main word line RMWL and RAI0–RAI3 signals, respectively.

FIG. 1E illustrates the row address strobe (RAS) timing generator 7 for issuing the RAE, XLAT, and XPRE signals to the row address decoder in response to the row address strobe input thereto.

Hereinbelow, a switching operation when a defective address contained in the memory cell array 11 is selected will be explained with reference to FIG. 2.

FIG. 2 is a circuit diagram of the row address decoder 14 of the circuit shown in FIG. 1. As shown in FIG. 2, the row address decoder 14 includes a first logic gate unit 16 which includes a plurality of inverters 17A–17D and a plurality of NAND gates 18A–18D, so as to decode X address signals X1B and X2B inputted from the X address buffer 1 (shown in FIG. 1A), and a plurality of address latch circuits 19A–19D for separating and latching an output "A" from the first logic gate unit 16 in response to an address latch (XLAT) signal and a precharge (XPRE) signal which are issued by RAS timing generator of FIG. 1E (discussed in further detail below), and for outputting the held value "B".

The row address decoder 14 further includes normal/redundancy switching circuits 21A–21D for switching the respective outputs "B" of the address latch circuits 19A–19D during normal operation, and also for switching redundancy row address signals RX1B2B, RX12B, RX1B2, and RX12, generated internally based on external command signals, during redundancy in response to a normal/redundancy judging (XRDN) signal issued by the redundancy control circuit 4 (illustrated in FIG. 1A based on an input from the redundancy decoder 2) and an inverted (complementary) signal thereof derived via an inverter 20, and for outputting the switched value "C".

Further, the row address decoder 14 includes a second logic gate circuit unit 22 including a plurality of NAND gates 23A–23D and a plurality of inverters 24A–24D, such that the outputs "C" of the normal/redundancy switching circuits 21A–21D are activated in response to a row address enable (RAE) signal issued by the RAS timing generator of FIG. 1E, thereby to produce a row address driver activated inversion signal "D" and row address driver activated signals RAIS 0–RAIS 3. Row address driver activated signals RAIS 0–RAIS 3 are provided to the respective driver circuits 15 shown in FIGS. 1A–1C. The respective driver circuit 15 in turn outputs an RAI signal having, for example, 4-bits.

The decode signal during the normal operation is separated and held by the single row address decoder 14, so that the decode signal during the normal operation and the decode signal during redundancy are commonly provided as the same outputs.

As described above, when the X address signals X1B and X2B are directly inputted into the NAND gates 18A–18D forming the first logic gate unit 16, or inputted via the inverters 17A–17D therein, one of the four outputs "A" from these NAND gates 18A–18D is activated. One decode signal activated by the first logic gate unit 16 is outputted at a low level, and then this low-level decode signal is inputted into, for example, an address latch circuit 19A.

The normal/redundancy switching circuits 21A–21D have inputted therein both the decode signals B having the normal addresses and the decode signals RX1B2B, RX12B, RX1B2, and RX12 having the redundant addresses. Accordingly, normal/redundancy switching circuits 21A–21D judge whether the decode signals are redundant based upon the redundancy judging signal XRDN (also inputted therein from the redundancy control circuit 4), and another redundancy judging signal XRDNB corresponding to a complementary signal (e.g., inverted signal issued by inverter 20) of the redundancy judging signal XRDN, thereby outputting a signal "C".

Normally, since the normal/redundancy judging signal XRDN and the redundant address signals RX1B2B, RX12B, RX1B2, and RX12 are delayed (e.g., normally by 1–2 ns due to inherent delays in the circuit structure) as compared with the normal address signal B, the timing of the XLAT signal is set equal to the timing of the redundant address signal RX1B2B.

As a result, in the normal/redundancy switching circuits 21A–21D, the normal address is prevented from being once outputted and then switched into the redundancy address during the redundancy judging operation. Accordingly, when the data of the outputs "C" from the normal/redundancy switching circuits 21A–21D are defined, the row address enable signal RAE is inputted into the plurality of NAND gates 23A–23D of the second logic gate unit 22, so that the plurality of RAIS0–RAIS3 signals are outputted.

Figure 3:
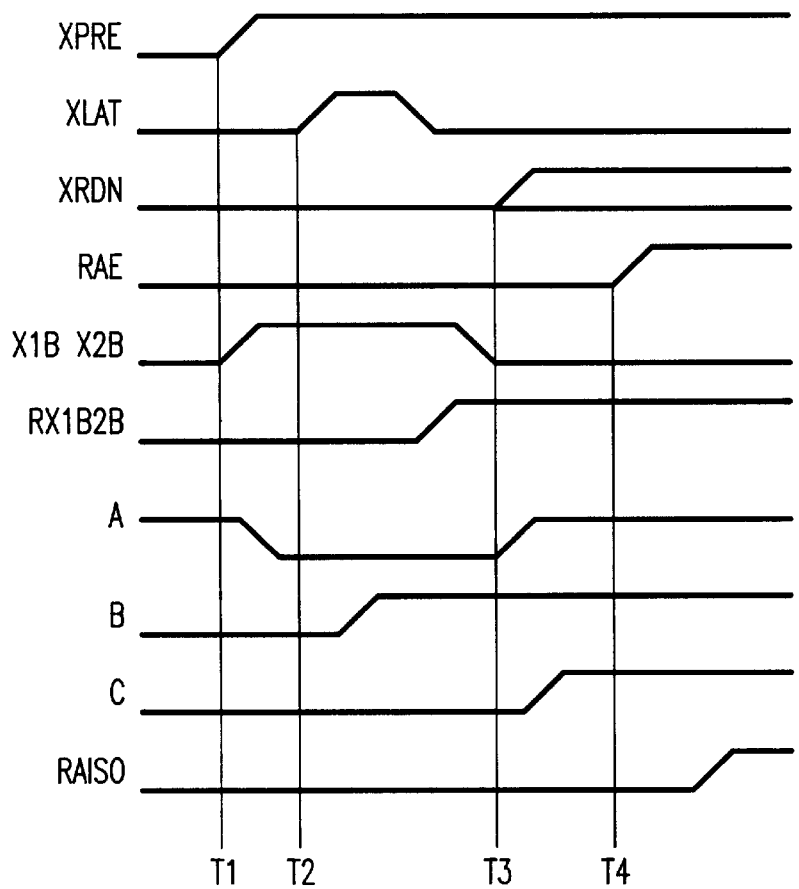
FIG. 3 is a timing chart for representing various signals in FIG. 2.

FIG. 3 is a timing chart for representing various signals in the circuit of FIG. 2.

Figure 4:
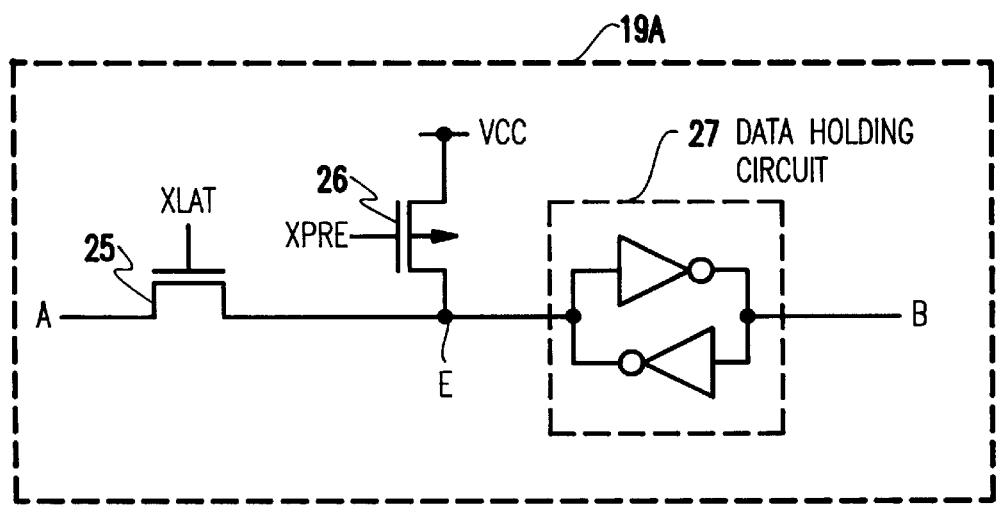
FIG. 4 is an address latch circuit diagram shown in the row address decoder of FIG. 2.

As indicated in FIG. 3, at a timing T1 when the precharge signal (XPRE) in FIG. 2 becomes "high" (e.g., a "1"), an intermediate point (namely, point "E" in the data latch 19A shown in greater detail in FIG. 4) of the address latch circuits 19A–19D is in a "high" floating state.

At a timing T2, when the address latch signal (XLAT) becomes a high level, a data input (e.g., an address signal) at point "A" is held at point "E". Also, at a timing T3 when the redundant address signal (RX1B2B) is selected and the redundancy switching circuit 21A–21D is operated, either an input at the point "B" or an input of the redundant address signal RX1B2B is selected, depending upon the normal operation or the redundancy operation.

At a timing T4, when the address enable signal (RAE) begins to achieve a high level, the RAIS signal is activated (e.g., goes "high") shortly thereafter.

FIG. 4 is a diagram of the address latch circuit 19A shown in FIG. 2, which is typical of the four address latch circuits 19A–19B shown in FIG. 2.

As shown in FIG. 4, the address latch circuit 19A preferably includes an NMOS transistor 25 functioning as a switching element, in which the output "A" of the first logic gate unit 16 is inputted and a gate thereof is controlled by the XLAT signal issued by the RAS timing generator of FIG. 1E.

A PMOS transistor 26 functioning as a switching element, is controlled between the NMOS transistor 25 and VCC, and has a gate controlled by the XPRE signal.

A data holding circuit 27, connected to the NMOS transistor 25 and formed by a CMOS inverter, outputs a latch output "B". The constructions of the data holding circuit is merely exemplary. Other structures also could be employed in forming the data holding circuit. The timings of the respective signals as well as the high/low states of data are illustrated in the timing diagram of FIG. 3.

First, since both the XPRE signal and the XLAT signal are at low levels before the address decode signal "A" is inputted (e.g., at the timing T1), the NMOS transistor 25 is turned "OFF" and the PMOS transistor 26 is turned "ON". Consequently, the address decode holding signal B corresponding to the output from the data holding circuit 27 is continuously outputted at the low level.

Next, the XPRE signal becomes a high level and the PMOS transistor 26 is turned "OFF" during the decode signal acquisition operation, so that the data holding circuit 27 continuously holds the decode signal B at the low level.

Furthermore, at a timing T2 when the address is changed, and the output "A" (e.g., the address decode signal) of the logic gate unit 16 changes from the high level to the low level, since the XLAT signal has one pulse with a high level, the NMOS transistor 25 is turned "ON" during the one pulse period, so that data opposite to such data held in the data holding circuit 27 is written.

As a result, the output "B" of the data holding circuit 27 becomes a high level, and further this high level data is continuously held. At this time, even when the inputted decode signal "A" is changed, since the NMOS transistor 25 is turned "OFF", the data with the high level is continuously held. Accordingly, no erroneous operation caused by the input of the next address occurs. Hence, the address latch circuit 19A continuously holds the data since the NMOS transistor 25 is at the low level at the timings T3 and T4.

Figure 5:
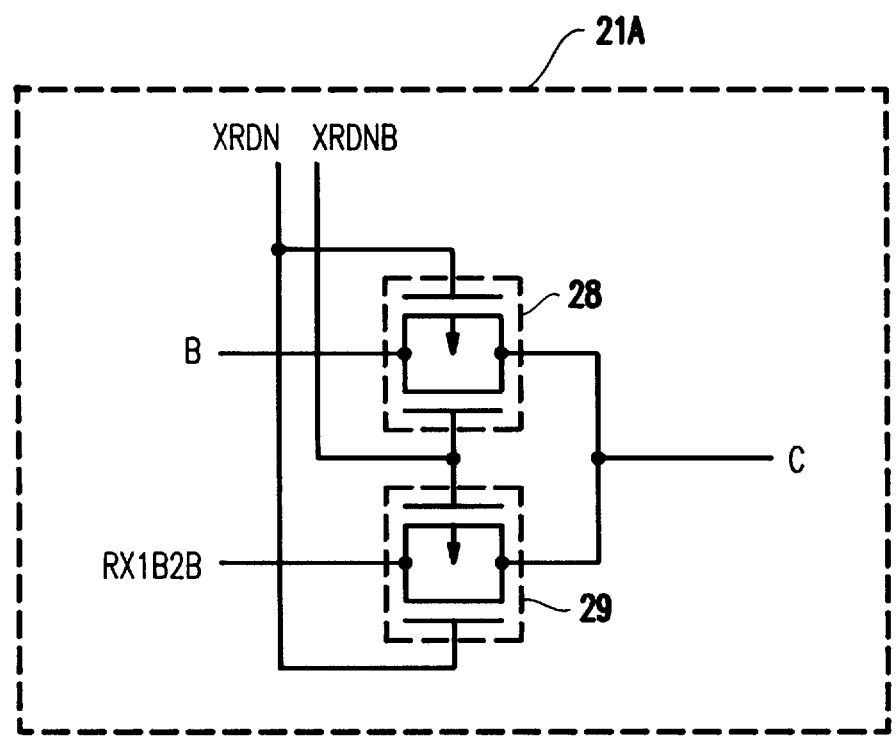
FIG. 5 is a normal/redundancy switching circuit diagram of the row address decoder shown in FIG. 2.

FIG. 5 is a diagram illustrating the normal/redundancy switching circuit 21A–21D in FIG. 2. As indicated in FIG. 5, a typical normal/redundancy switching circuit 21A among the four normal/redundancy switching circuits preferably includes two CMOS transfer gates 28 and 29 in which a PMOS transistor and an NMOS transistor, respectively, are preferably connected parallel to each other.

The decode hold signal "B" of the normal address is inputted into the first transfer gate 28, whereas the decode signal RX1B2B of the redundant address is inputted to the second transfer gate 29. Both the first transfer gate 28 and the second transfer gate 29 are controlled by the redundancy judging signal XRDN and the complementary signal XRDNB thereof, thereby to output a switching output "C" as the RAI selection signal.

First, under initial condition, namely, at the timing T1, both the input "B" during the normal operation and the input RX1B2B during the redundancy operation are at low levels. At this time, since the redundancy judging signal XRDN becomes the low level and the complementary signal XRDNB thereof becomes the high level, the first CMOS transfer gate 28 is turned "ON" and the second CMOS transfer gate 29 is turned "OFF". Consequently, the output signal "C" is outputted while the input "B" remains at the low level, since the first CMOS transfer gate 28 is turned "ON".

Next, as represented at the timing T2, since the redundancy control circuit 4 (shown in FIG. 1A) is not operated, if the normal address is selected, then the judging signal XRDN remains at the low level and the complementary signal XRDNB thereof remains at the high level, so that the input "B" is directly outputted as the RAI selection signal "C".

On the other hand, as indicated at a timing T3, when the redundancy control circuit (shown in FIG. 1A) is operated and then the redundancy address is selected, the normal/redundancy judging signal XRDN becomes the high level and the complementary signal XRDNB thereof becomes the low level. Accordingly, the input RX1B2B is outputted at "C", and the address is switched from the normal address to the redundancy address. It should be noted that an operation contrary to the above processing could be similarly performed. For example, a low-level signal could be employed instead of a high-level.

Thereafter, as shown in a timing T4, when the row address enable signal RAE becomes high, the C output which has become high is outputted while the row address driver activated signal RAIS0 becomes a high level.

According to the preferred embodiment of the drive circuit of the semiconductor device of the present invention, while the decode signal during the normal operation is separated and held, even when the continuous address signal is inputted, no erroneous operation occurs because the data has been separated.

Furthermore, since the address signal and the decode signal during the normal operation and the redundancy operation are switched, the decoded outputs are made identical to each other. That is, the normal address decode hold signal B and the address decode signal RX1B2B for redundancy are switched by the row address decoder 14, so that one driver circuit 15 can be commonly used both for the normal operation and for the redundancy operation.

Figure 6:
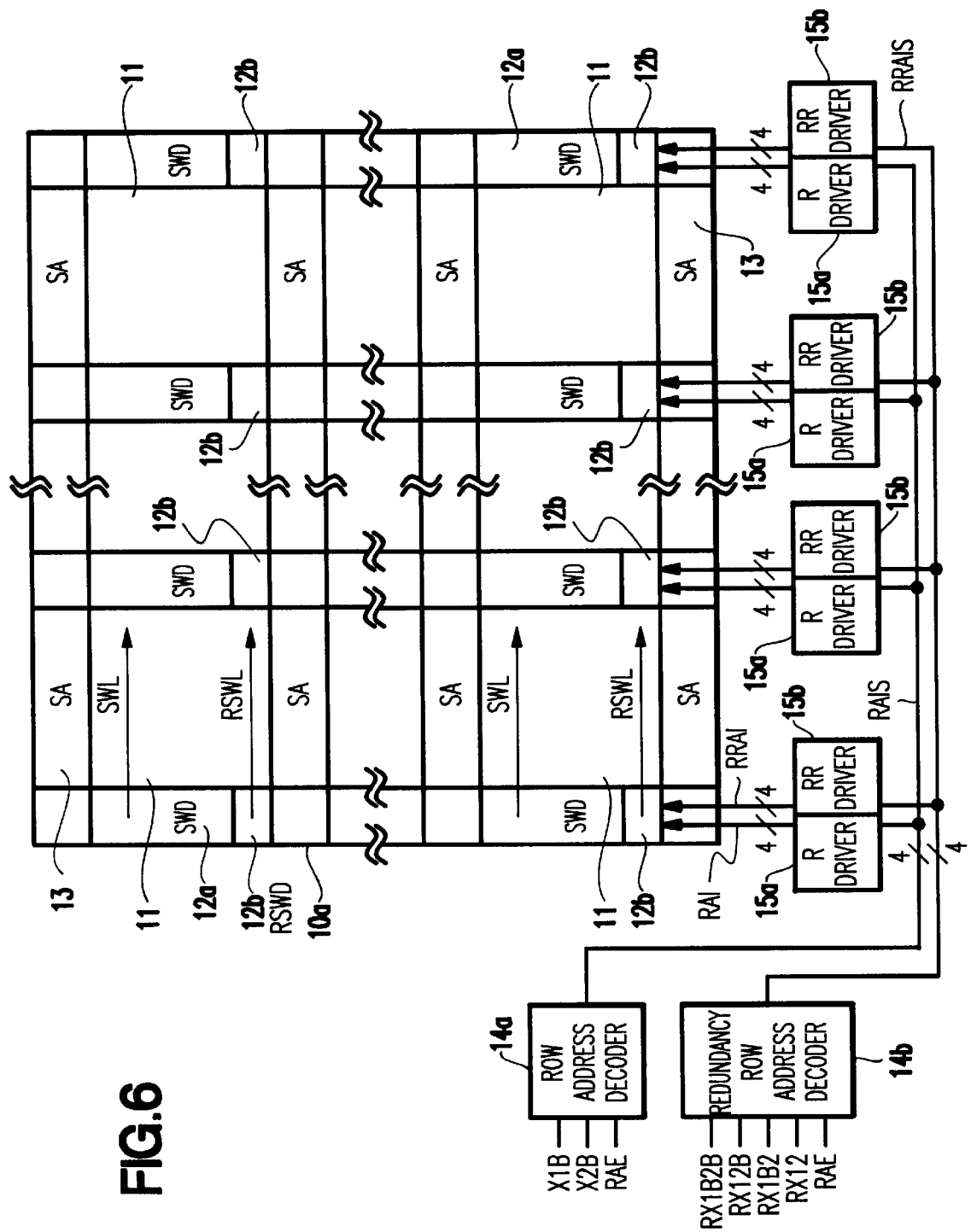
FIG. 6 is a circuit diagram of a "related art" drive circuit of a semiconductor memory device.

As a result, the driver circuit 15b, exclusively used for redundancy in the "related art" circuit shown in FIG. 6, is not required, so that the number of circuits can be reduced by one-half.

Further, since the row address selection signal (RAI selection signal) can be commonly used, the number of wiring lines which pass over the subword drivers (SWD) 12a can be reduced by one-half, and thus, the chip area can be greatly reduced, as compared to the "related art" circuit.

As described above, the drive circuit of the semiconductor memory device according to the present invention includes one (e.g., a single) row address decoder including a first logic gate unit for decoding the row address signal, an address latch circuit for separating and holding the output of the first logic gate unit in response to the XLAT signal and the XPRE signal, a normal/redundancy switching circuit for switching the output of the address latch circuit during normal operation and the row address signal during redundancy in response to the XRDN signal, and a second logic gate unit for producing row address decode signals used for the plurality of memory cell arrays by activating the output of the normal/redundancy switching circuit in response to the row address enable signal.

Consequently, the row address driver selection signal during the normal operation is made identical to the row address driver selection signal during the redundancy operation, so that the row address driver is commonly used, and the number of row address wiring lines which pass over the subword drivers can be reduced by one-half. Therefore, the chip size is greatly reduced.

Another advantage of the present invention is that it is easy to construct and it occupies less chip real estate than the "related art" arrangements discussed above. Once again, it is noted that the chip size and optimizing the chip arrangement are very important due to the fixed size of many wafer substrates (e.g., 8" or the like). Additionally, due to the simpler circuit design, the operational speed is increased as compared to the "related art" circuits.

While the invention has been described in terms of a single preferred embodiment, those skilled in the art will recognize that the invention can be practiced with modification within the spirit and scope of the appended claims.

Having thus described my invention, what I claim as new and desire to secure by letters patent is as follows:

1. A drive circuit of a semiconductor memory device for driving a plurality of memory cell arrays and for use with an external address buffer, comprising:

a single, row address decoder, said row address decoder including:
a first logic gate unit, coupled to receive a row address signal from the external address buffer, for decoding the row address signal input thereto, and for providing an output;
an address latch circuit, operatively coupled to said first logic gate unit for holding the output of said first logic gate unit in response to an address latch signal and a precharge signal inputted thereto;
a switching circuit, operatively coupled to said address latch circuit, for switching the output of said address latch circuit during a first operation and the row address signal during a second operation, respectively, in response to whether a first judging signal or a second judging signal is inputted thereto; and a second logic gate unit, operatively coupled to said switching circuit, for producing row address decode signals used for said plurality of memory cell arrays by activating an output of said switching circuit in response to a row address enable signal inputted to said second logic gate unit, wherein a row address decode signal during said first operation is separated and held, and wherein said row address decode signal during the first-operation and a row address decode signal during the second operation are provided at the same output.

2. A drive circuit according to claim 1, wherein said address latch circuit includes:
a first switching transistor for receiving the output of said first logic gate unit, and having a gate controlled by said address latch signal.

3. A drive circuit according to claim 2, wherein said address latch circuit further includes:
a second switching transistor connected between said first switching transistor and a power source, and having a gate controlled by said precharge signal.

4. A drive circuit according to claim 3, wherein said address latch circuit further includes:
a data holding circuit, connected between said first switching transistor and the output of said address latch circuit, and including a complementary-metal-oxide-semiconductor (CMOS) inverter.

5. A drive circuit according to claim 1, wherein said address latch circuit includes:
a first switching transistor for inputting therein the output of said first logic gate unit, and having a gate controlled by said address latch signal;
a second switching transistor connected between said first switching transistor and a power source, and having a gate controlled by said precharge signal; and
a data holding circuit connected between said first switching transistor and the output of said address latch circuit.

6. A drive circuit according to claim 1, wherein said first operation comprises a normal operation and said second operation comprises a redundancy operation,
wherein said switching circuit includes a switching circuit for selectively switching between said normal operation and said redundancy operation and comprising first and second transfer gates.

7. A drive circuit according to claim 6, wherein each of said first and second transfer gates includes a complementary-metal-oxide-semiconductor (CMOS) transistor.

8. A drive circuit according to claim 7, wherein said first and second transfer gates respectively comprise a PMOS transistor and an NMOS transistor being parallel-connected.

9. A drive circuit according to claim 7, wherein each of said first and second transfer gates receives a decode signal of a normal address and a decode signal of a redundancy address.

10. A drive circuit according to claim 9, wherein outputs of each of said first and second transfer gates are selectively controlled based upon said judging signal having a level indicative of said first operation or said second operation.

11. A drive circuit according to claim 1, wherein said switching circuit includes first and second transfer gates, wherein each of said first and second transfer gates receives a row address decode signal of a first address and a row address decode signal of a second address, and outputs of said first and second transfer gates are selectively controlled based upon said judging signal having a level indicative of said first operation or said second operation.

12. A memory, comprising:
a plurality of memory cell blocks;
a plurality of subword drivers, operatively coupled and corresponding to the plurality of memory cell blocks, for selecting respective subword lines;
a plurality of drivers, coupled to said subword lines, for providing information to the subword lines, said drivers receiving first and second types of information depending on a normal mode and a redundancy mode of said memory; and
a single, row address decoder, operatively coupled to said plurality of drivers, for selectively providing said first and second types of information to said plurality of drivers.

13. A memory, comprising:
at least one main word line;
at least one redundant main word line arranged in regard to said at least one main word line;
a first driver, operatively coupled to said at least one main word line, for driving said at least one main word line;
a second driver, operatively coupled to said at least one redundant main word line, for driving said at least one redundant main word line;
means, operatively coupled to said first and second drivers, for selectively issuing first and second signals to said first and second drivers depending upon a normal mode and a redundancy mode, respectively;
a row driver, operatively coupled to both said first and second drivers, for outputting a same output selectively used with each of said first and second drivers, depending upon whether said first signal or said second signal is issued by said means; and
a single, row address decoder, operatively coupled to said row driver, for selectively receiving said first and second signals and for providing an input to said row driver.

14. A memory according to claim 13, further comprising a plurality of third drivers for coupling said at least one main word line to a plurality of subword lines, and a plurality of fourth drivers for coupling said at least one redundant main word line to a plurality of redundant subword lines.

15. A semiconductor device, comprising:
a subword driver for receiving a main row signal and a redundant main row signal and for selecting one of a plurality of subword lines;
a row driver, operatively coupled to said subword driver, for receiving a row-address-activate-signal and for driving a row address by said row-address-activate-signal;
a single row address decoder, operatively coupled to said row drivers for receiving normal address signals, redundancy address signals and a judging signal, and for outputting a first row-address-activate-signal corresponding to the normal address signals by the judging signal having a first level in a normal mode, and for outputting a second row-address-activate-signal, corresponding to the redundancy address signals, by the judging signal having a second level in a redundancy mode.

16. A drive circuit for driving a plurality of memory cell blocks, comprising:
a plurality of word line drivers corresponding to said memory cell blocks, said drivers for providing an information signal to word lines; and a single, row address decoder, operatively coupled to said plurality of word line drivers, for selectively receiving first and second signals and for providing an input to drive one of said word lines, said drivers for receiving first and second types of information based on said first and second signals provided to said single row address decoder depending on a first mode and a second mode.

17. A drive circuit according to claim 16, wherein said information comprises address information.

18. A drive circuit according to claim 16, wherein said first mode comprises a normal mode and said second mode comprises a redundancy mode.

19. A drive circuit for a semiconductor memory device, including:

at least one main word line;

a plurality of subword lines coupled to said at least one main word line;

at least one redundant main word line arranged in regard to said at least one main word line;

a plurality of redundant subword lines coupled to said at least one redundant main word line;

a row address driver, commonly provided for and operatively coupled to said plurality of subword lines and said plurality of redundant subword lines, for providing a same output to said plurality of subword lines and said plurality of redundant subword lines; and a single row address decoder, operatively coupled to said row address driver, for selectively receiving first and second signals, and for providing an input to said row address driver.

20. A method of driving a plurality of memory cell arrays of a semiconductor memory device by a drive circuit, said method comprising the steps of:

providing a single, row address decoder in said drive circuit for driving said semiconductor memory device;

decoding, by a first logic gate unit in said row address decoder, a row address signal input thereto;

holding, by an address latch circuit of said row address decoder, the output of said first logic gate unit in response to an address latch signal and a precharge signal inputted thereto;

switching, by a switching circuit of the row address decoder, the output of said address latch circuit during a first operation and the row address signal during a second operation in response to a judging signal inputted thereto and having a first characteristic or a second characteristic; and producing, by a second logic gate unit of said row address decoder, row address decode signals used for said plurality of memory cell arrays by activating an output of said switching circuit in response to a row address enable signal inputted to said second logic gate unit, wherein a row address decode signal during said first operation is separated and held, and wherein said row address decode signal during the first operation and a row address decode signal during the second operation are provided at the same output.

21. A method according to claim 20, wherein said holding step includes:

inputting into a first switching transistor of said address latch circuit the output of said first logic gate unit; and controlling a gate of said first switching transistor by said address latch signal.

22. A method according to claim 21, wherein said holding step further includes:

connecting a second switching transistor between said first switching transistor and a power source; and controlling a gate of said second switching transistor by said precharge signal.

23. A method according to claim 22, wherein said holding step further includes:

connecting a data holding circuit including a complementary metal oxide semiconductor (CMOS) inverter, between said first switching transistor and the output of said address latch circuit.

24. A method according to claim 20, wherein said holding step includes:

inputting into a first switching transistor of said address latch circuit the output of said first logic gate unit;

controlling a gate of said first switching transistor by said address latch signal;

connecting a second switching transistor between said first switching transistor and a power source;

controlling a gate of said second switching transistor by said precharge signal; and connecting a data holding circuit between said first switching transistor and the output of said address latch circuit.

25. A method according to claim 20, wherein said step of switching includes providing said switching circuit which comprises a switching circuit for a normal mode and a redundant mode with first and second transfer gates, and wherein each of said first and second transfer gates includes a complementary metal oxide semiconductor (CMOS) transistor.

26. A method according to claim 25, further comprising a step of:

inputting, into each of said first and second transfer gates, a decode signal of a normal address and a decode signal of a redundancy address.

27. A method according to claim 26, further comprising a step of:

controlling outputs of each of said first and second transfer gates based upon whether said judging signal has said first characteristic or said second characteristic.

28. A method according to claim 20, further comprising steps of:

providing said switching circuit which comprises a switching circuit for a normal mode and a redundancy mode, with first and second transfer gates, inputting, into each of said first and second transfer gates, a decode signal of a normal address and a decode signal of a redundancy address; and controlling outputs of said first and second transfer gates based upon whether said judging signal has said first characteristic or said second characteristic, said judging signal having said first characteristic comprising a judging signal having a normal characteristic, and said judging signal having said second characteristic comprising a judging signal having a redundancy characteristic.

29. A semiconductor memory device, comprising:

a plurality of word lines;

a plurality of redundancy-word lines arranged in regard to said plurality of word lines;

a set of signal lines supplied with selection information;

a first select line, operatively coupled to said plurality of word lines, supplied with a word line activating signal for activating a word line of said plurality of word lines;

a second select line, operatively coupled to said plurality of redundancy-word lines, supplied with a redundancy-word line activating signal for activating a redundancy-word line of said plurality of redundancy-word lines;

a first driver circuit, coupled to said set of signal lines and said first select line, for driving one of said word lines in response to said selection information when said word line activating signal takes an active level; and a second driver circuit, coupled to said set of signal lines and said second select line, for driving one of said redundancy-word lines in response to said selection information when said redundancy-word line activating signal takes an active level; and a single, row address decoder, operatively coupled to said first and second driver circuits and receiving first and second signals, for providing an input 2 1 to drive a selected one of said word lines and said redundancy-word lines.

30. The device as claimed in claim 29, further comprising:

a decoder circuit, coupled to said set of signal lines, for producing, said first signal for selecting one of said word lines and said second signal for selecting one of said redundancy-word lines.

* * * * *

UNITED STATES PATENT AND TRADEMARK OFFICE
CERTIFICATE OF CORRECTION

PATENT NO. : 5,848,006
DATED : December 8, 1998
INVENTOR(S) : Nagata

It is certified that error appears in the above-identified patent and that said Letters Patent is hereby corrected as shown below:

REDUNDANT SEMICONDUCTOR MEMORY DEVICE USING A SINGLE ROW ADDRESS DECODER FOR DRIVING BOTH SUB-WORDLINES AND REDUNDANT SUB-WORDLINES

Signed and Sealed this

Eighth Day of June, 1999

Attest:

Q. TODD DICKINSON

*Attesting Officer*   Acting Commissioner of Patents and Trademarks